United States Patent
Roitshtein et al.

(10) Patent No.: US 9,619,584 B1
(45) Date of Patent: Apr. 11, 2017

(54) PARALLEL MULTI-LOOKUP TCAM

(71) Applicant: MARVELL ISRAEL (M.I.S.L) LTD., Yokneam (IL)

(72) Inventors: Amir Roitshtein, Holon (IL); Gil Levy, Hod Harsharon (IL); Lior Valency, Tel-Aviv (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 340 days.

(21) Appl. No.: 14/450,843

(22) Filed: Aug. 4, 2014

Related U.S. Application Data

(60) Provisional application No. 61/861,569, filed on Aug. 2, 2013.

(51) Int. Cl.
*G06F 17/30* (2006.01)
*G11C 15/00* (2006.01)

(52) U.S. Cl.
CPC ........ *G06F 17/30982* (2013.01); *G11C 15/00* (2013.01)

(58) Field of Classification Search
None
See application file for complete search history.

(56) References Cited

U.S. PATENT DOCUMENTS

| | | | | |
|---|---|---|---|---|
| 6,181,592 B1* | 1/2001 | Aoki | ...................... | G11C 15/00 365/49.1 |
| 9,430,511 B2* | 8/2016 | Billa | ................. | G06F 17/30327 |
| 2004/0205292 A1* | 10/2004 | Lu | ...................... | H04L 45/7453 711/108 |
| 2005/0262294 A1* | 11/2005 | Bitar | ...................... | G11C 15/00 711/108 |
| 2014/0050002 A1* | 2/2014 | Sun | ...................... | G11C 15/00 365/49.1 |

* cited by examiner

*Primary Examiner* — William Spieler

(57) ABSTRACT

Aspects of the disclosure provide a circuit that includes a content addressable memory (CAM) array, a first mask circuit and a first encoder. The CAM array has CAM entry lines to be compared with a search key. The CAM array is configured to output a match result indicative entry lines that match the search key. The first mask circuit is configured to selectively mask first one or more portions of the match result to generate a first masked match result indicative first entry lines among the entry lines that match the search key. The first encoder is configured to encode the first masked match result to identify a matching entry line in the first entry lines as a first search result.

20 Claims, 3 Drawing Sheets

PARALLEL MULTI-LOOKUP TCAM

INCORPORATION BY REFERENCE

This present disclosure claims the benefit of U.S. Provisional Application No. 61/861,569, "Parallel Multi-lookup TCAM" filed on Aug. 2, 2013, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, content addressable memory (CAM) is used in various applications to provide a relatively fast searching capability. In an example, a network device, such as a network switch, a router and the like, includes a ternary CAM (TCAM) to store criteria for a plurality of switching rules. In an example, a criterion includes a range requirement that occupies one or more TCAM entries, and addresses of the TCAM entries point to action codes associated with the criterion. When the network device receives a packet, selected attributes of the packet are extracted to form a search key. The search key is compared with plural TCAM entries to find a matching entry from among the TCAM entries. The address of the matching entry points to an action code. According to the action code, the network device takes specified actions on the packet.

SUMMARY

Aspects of the disclosure provide a circuit that includes a content addressable memory (CAM) array, a first mask circuit and a first encoder. The CAM array has CAM entry lines to be compared with a search key. The CAM array is configured to output a match result indicative of entry lines that match the search key. The first mask circuit is configured to selectively mask first one or more portions of the match result to generate a first masked match result indicative first entry lines among the entry lines that match the search key. The first encoder is configured to encode the first masked match result to identify a matching entry line in the first entry lines as a first search result.

Further, the circuit includes a second mask circuit and a second encoder. The second mask circuit is configured to selectively mask second one or more portions of the match result to generate a second masked match result indicative second entry lines among the entry lines that match the search key. The second encoder is configured to encode the second masked match result to identify a matching entry line in the second entry lines as a second search result.

In an example, the circuit includes a key generator configured to generate the search key in response to search requests from a first search client and a second search client.

In an embodiment, the match result is a bitmap and the first mask circuit includes a memory configured to store a first mask, and a logic circuit configured to bitwise combine the bitmap with the first mask with logic operations.

Aspects of the disclosure provide a method. The method includes comparing a search key with entry lines in a content addressable memory (CAM) array to output a match result indicative entry lines that match the search key, selectively masking first one or more portions of the match result to generate a first masked match result indicative first entry lines among the entry lines that match the search key, and encoding the first masked match result to identify a matching entry in the first entry lines as a first search result.

Aspects of the disclosure provide an apparatus that includes a packet processing circuit and a search engine. The packet processing circuit is configured to generate search requests in response to a packet to determine actions on the packet. The search engine includes at least one key generator, a content addressable memory (CAM) array, a first mask circuit and a first decoder. The at least one key generator is configured to generate two or more different search keys in response to a first one of the search requests. The CAM array has CAM entry lines to be compared with the two or more different search keys. The CAM array is configured to output a match result indicative of entry lines that match a first search key. The first mask circuit is configured to selectively mask first one or more portions of the match result to generate a first masked match result indicative first entry lines among the entry lines that match the first search key. The first encoder is configured to encode the first masked match result to identify a matching entry line in the first entry lines as a first search result in response to the first one of the search requests.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
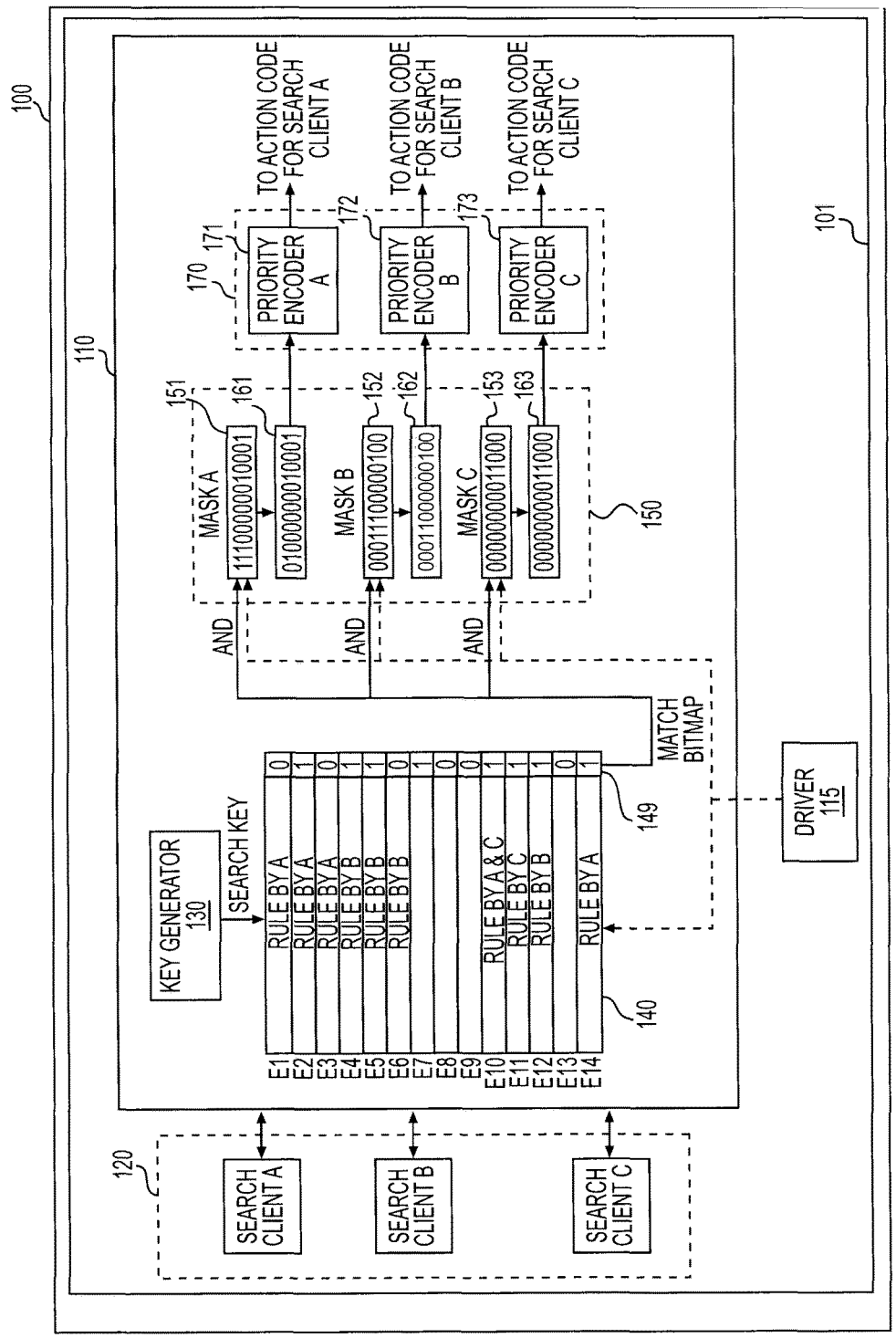
FIG. 1 shows a block diagram of an electronic device 100 according to an embodiment of the disclosure.

FIG. 1 shows a block diagram of an electronic device 100 according to an embodiment of the disclosure. The electronic device 100 includes a content addressable memory (CAM) based search engine 110. In the FIG. 1 example, the search engine 110 includes a key generator 130, a ternary content addressable memory (TCAM) array 140, a mask module 150 and a priority encoder module 170. These elements are coupled together as shown in FIG. 1.

According to an aspect of the disclosure, the key generator 130 generates a search key and provides the search key to the TCAM array 140; the TCAM array 140 compares the search key with entry lines in the TCAM array 140 and outputs a match result indicative of matching status of each of the entry lines to the search key, such as a bitmap in the FIG. 1 example. The mask module 150 is configured to be able to combine the match result with a mask to mask one or more portions of the entry lines and allow a portion of the entry lines to be selected according to the mask. The priority encoder module 170 is configured to encode the masked match result to an index associated with a selected entry line that matches the search key.

Further, according to an aspect of the disclosure, the mask module 150 includes multiple marks respectively for multiple search based applications. In an embodiment, the TCAM array 140 is shared by the multiple search based applications, and the entry lines are individually assigned to the multiple search applications. A mask for a search based application is determined based on an allocation of the entry lines to the search based application. In an example, the mask is used to block bits in the bitmap that indicate the matching status of entry lines that are allocated to other search based applications. In an example, the mask module 150 respectively combines the bitmap with the masks to generate multiple masked bitmaps respectively for the multiple search based applications. For example, to generate a masked bitmap for a search based application, the mask module 150 keeps the values of the bits that are indicative of the matching status of the allocated entry lines for the search based application, and sets a value of no-match to the rest of the bits in the masked bitmap. The priority encoder module 170 encodes the multiple masked bitmaps respectively for the multiple search based applications. In an embodiment, the mask module 150 generates the multiple masked bitmaps in parallel, and the priority encoder module 170 encodes the multiple masked bitmaps in parallel.

The electronic device 100 can be any suitable device that uses a search engine to match a received pattern to stored data patterns. In the FIG. 1 example, the electronic device 100 is a network device 100, such as a network switch, a router, and the like. The network device 100 includes a packet processor 101 configured to process packets, in an embodiment. For example, the network device 100 receives incoming packets from other devices via ingress ports (not shown), and the packet processor 101 processes the packets, and determines actions on the packets, such as forwarding a packet to one or more egress ports (not shown) to output the packet, filtering a packet based on a security check, assigning quality of service values, statistics gathering for network management/security and the like, based on attributes of the packets, such as information in the headers.

According to an aspect of the disclosure, the packet processor 101 determines actions on packets based on rules. In an embodiment, a rule includes criteria and an action code associated with the criteria. The criteria specify data patterns for attributes. In an example, a data pattern is in the format of range requirements and/or exact match requirements. In an embodiment, a switching rule might be expressed, for example, in plain English as "permit forwarding a packet with source address 172.15.5.0, TCP port number between 1 to 14". The switching rule includes a source address criterion, a protocol (TCP) criterion, a TCP port number criterion, and an action code "permit forwarding" in association with the criteria. The source address criterion and the protocol criterion are exact match requirements that require specific packet fields to exactly match the values specified in the criteria. The TCP port number criterion is a range requirement that requires a specific packet field is in a range specified in the criterion. When a received packet satisfies all the criteria, an action according to the action code can be taken on the received packet. It is noted that the rules can also include Layer 2 address information, Layer 4 application information and the like.

In the FIG. 1 example, the packet processor 101 includes a processing circuit 120 coupled with the search engine 110. In an embodiment, the processing circuit 120 is configured to form a plurality of search clients, such as search clients A-C, that require search service from the search engine 110. In an embodiment, the search clients are, for example, individual stages in a packet processing pipeline. In another embodiment, the search clients are processing functionalities in a software flow that is run on a run-to-completion architecture processor device. In an example, the search clients are configured to perform packet processing applications and are implemented as packet processing hardware (e.g., circuits) executing instruction codes. For example, the search client A is configured to act on packets based on security check rules, the search client 13 is configured to act on packets based on quality of service assignment rules, and the search client C is configured to act on packets based on forwarding rules. The security check rules, the quality of service assignment rules and the forwarding rules are stored in the search engine 110. The search clients A-C request the search engine 110 to search for appropriate rules to be applied to each packet, and then act on the packet according to the appropriate rules.

According to an aspect of the disclosure, criteria of the rules are stored in the search engine 110, and the action codes are stored separately from the criteria in an embodiment. In an embodiment, the criteria are stored in the search engine 110 as entries that are indexed and the action codes are stored in a memory (not shown) at address that are pointed by indexes of the entries. In an example, the index of an entry storing criteria points to an address in the memory that stores an action code associated with the criteria.

Various criteria are stored in the search engine 110. The search engine 110 uses any suitable techniques to store the various criteria. In the FIG. 1 example, the search engine 110 includes the TCAM array 140 to store various criteria. The TCAM array 140 is shared by multiple search clients, such as shared by the search clients A-C. The search engine 110 provides multiple match results for the multiple search clients in response to a search key, in a single clock cycle in an example.

In an example, the TCAM array 140 includes a plurality of ordered TCAM entry lines, such as entry lines E1-E14, and the like. A TCAM entry line includes a plurality of TCAM cells that each is configured to store ternary states, and thus each TCAM entry line is able to store range requirements representable in a binary aligned form. For example, [16, 31] (a range of integers inclusive from sixteen to thirty one) is represented in the binary aligned form as "01XXXX", where "X" represents a mask that matches both binary "0" and binary "1". Thus, [16, 31] is storable in a single entry line of the TCAM array 140. In another example, [16, 32] is expandable as a combination of [16, 31] and [32, 32] that are represented in the binary aligned form as "01XXXX" and "100000", thus the TCAM array 140 needs to use two entries to store [16, 32].

According to an aspect of the disclosure, the rules to be applied by different search clients can specify criteria for the same attributes or different attributes. In an example, in each entry line, the TCAM cells are allocated to attributes cumulated from all the search clients that share the TCAM array 140. When a rule does not specify requirement for certain attributes, the TCAM cells allocated to the certain attributes are set to "X". In an example, the rules to be applied by the search client A specify criteria for source IP address, the rules to be applied by the search client B specify criteria for differentiated service code point (DSCP), and the rules to be applied by the search client C specify criteria for source IP address. Then, each entry line has a first field of TCAM cells allocated to store criteria for source IP address and a second field of TCAM cells allocated to store criteria for DSCP. In the example, the rules to be applied by the search client A and the rules to be applied by the search client C use the same attribute, thus the first field is used for both the rules to be applied by the search client A and the rules to be applied by the search client C. In this example, the TCAM array 140 is used space-efficiently.

According to an aspect of the disclosure, the TCAM array 140 has a write mode and a search mode. In the search mode, the TCAM array 140 receives a search key and compares the search key with each of the entry lines in the TCAM array 140 at the same time. In an embodiment, the key generator 130 generates the search key based on a packet in response to search requests from the search clients A-C. The search key includes values based on the packet for the all the cumulated attributes, such as the IP address, ingress port, and the DSCP of the packet. The TCAM array 140 generates a match bitmap 149 indicative of the match status of the search key to all the entry lines in the TCAM array 140. In an example, for each entry line, bits in the search key are compared with the ternary states stored in the corresponding TCAM cells of the entry line. When a bit in the search key has the same value as the state stored in the corresponding TCAM cell or when the state in the corresponding TCAM cell is "X", the bit matches the corresponding TCAM cell. When all the bits in the search key match the corresponding TCAM cells of the entry line, the search key matches the entry line. When at least one bit in the search key does not match the corresponding TCAM cell, the search key does not match the entry line.

Each entry line generates a bit in the match bitmap 149 with comparison to the search key. The bit value is used to indicate the match status of the search key to the entry line. In an example, bit value "1" (e.g., a relatively high voltage level) indicates a match of the entry line to the search key and bit value "0" (e.g., about ground level) indicates a no-match of the entry line to the search key.

According to an aspect of the disclosure, the memory space of the TCAM array 140 is shared by multiple search clients. In the FIG. 1 example, the entry lines of the TCAM array 140 are used to store the criteria for rules to be applied by the search clients A-C. For example, entry lines E1-E3, E10 and E14 are used to store criteria for rules to be applied by the search client A; entry lines E4-E6 and E12 are used to store criteria for rules to be applied by the search client B; and entry lines E10 and E11 are used to store criteria for rules to be applied by the search client C. It is noted that, in an example, an entry line can be allocated to multiple search clients. For example, the search client A and the search client C have a common rule, thus one or more entry lines, such as the entry line E10 and the like, is allocated to both the search client A and the search client C to store the criteria for the common rule.

It is noted that, in the FIG. 1 example, the entry lines are individually allocable to different search clients, and there is no need to allocate consecutive entry lines to the same search clients. The rule inserting and deleting from the TCAM array 140 can be easily managed, for example, using the mask module 150.

The mask module 150 stores the masks determined based on the entry line allocation, and is configured to combine the match bitmap with the masks to generate the masked bitmaps. For example, the mask module 150 includes suitable memory circuits 151-153, such as registers, flip-flops, and the like, configured to store the masks. For example, the memory circuits 151 store a first mask determined based on the entry line allocation for the search client A, the memory circuits 152 store a second mask determined based on the entry line allocation for the search client B, and the memory circuits 153 store a third mask determined based on the entry line allocation for the search client C.

In the FIG. 1 example, each mask includes a plurality of bits respectively corresponding to the entry lines in the TCAM array 140. The values of the plurality of bits are determined based on the allocation of the corresponding entry lines. For example, the entry lines E1-E3, E10 and E14 are allocated to the search client A, bits in the first mask corresponding to the entry lines E1-E3, E10 and E14 are assigned to value "1", and the rest of the bits in the first mask are assigned to value "0". The entry lines E4-E6 and E12 are allocated to the search client B, bits in the second mask corresponding to the entry lines E4-E6 and E12 are assigned to value "1", and the rest of the bits in the second mask are assigned to value "0". The entry lines E10 and E11 are allocated to the search client C, bits in the third mask corresponding to the entry lines E10 and E11 are assigned to value "1", and the rest of the bits in the third mask are assigned to value "0". It is noted that other suitable value assignment scheme can be used.

The mask module 150 combines the match bitmap 149 with the masks to generate the masked bitmaps respectively associated with search clients. In a masked bitmap associated with a search client, bits corresponding to the entry lines allocated to the search client have the same value as the match bitmap 149 and the bits corresponding to the entry lines allocated to the other search clients are set to values of no-match.

In the FIG. 1 example, the mask module 150 uses bitwise logic AND operations to combine the match bitmap 149 with the masks. For example, the mask module 150 performs bitwise AND operation to combine the match bitmap 149 with the first mask to generate a first masked bitmap 161 associated with the search client A; performs bitwise AND operation to combine the match bitmap 149 with the second mask to generate a second masked bitmap 162 associated with the search client B; and performs bitwise AND operation to combine the match bitmap 149 with the third mask to generate a third masked bitmap 163 associated with the search client C. It is noted that the mask module 150 can use other suitable operations to combine the match bitmap 149 with the masks.

Further, according to an aspect of the disclosure, the priority encoder module 170 respectively encodes the masked bitmaps into indexes pointing to action codes for the search clients A-C. In the FIG. 1 example, the priority encoder module 170 includes priority encoders 171-173 to respectively encode the masked bitmaps 161-163. In an example, the priority encoders 171-173 operate in parallel to respectively encode the masked bitmaps 161-163. It is noted that, in another example, the priority encoder module 170 includes a single priority encoder to sequentially encode the masked bitmaps 161-163.

In an example, the priority encoder 171 is configured to determine a matching entry line of a highest priority based on the masked bitmap 161, such as the entry line E2 in the FIG. 1 example, and output an index associated with the entry line E2. The index points to a memory location storing an action code associated with the criteria stored in the entry line E2. Similarly, the priority encoder 172 is configured to determine a matching entry line of a highest priority based on the masked bitmap 162, such as the entry line E4 in the FIG. 1 example, and output an index associated with the entry line E4. The index points to a memory location storing an action code associated with the criteria stored in the entry line E4. The priority encoder 173 is configured to determine a matching entry line of a highest priority based on the masked bitmap 163, such as the entry line E10 in the FIG. 1 example, and output an index associated with the entry line E10. The index points to a memory location storing an action code associated with the criteria stored in the entry line E10.

According to an aspect of the disclosure, the electronic system 100 includes a driver 115 configured to control the rule storage in the entry lines of the TCAM array 140 and update the masks in the mask module 150 according to the entry line allocation. In an example, when the driver 115 receives criteria for a rule to be applied by the search client A, the TCAM array 140 enters the write mode, and the driver 115 allocates one or more empty entry lines to the search client A, and writes the criteria in the allocated entry lines. In addition, the driver 115 updates the first mask for the search client A. In an example, the driver 115 sets the bits corresponding to the allocated entry lines to value "1".

In another example, the driver 115 also controls de-allocation of entry lines. For example, when a rule for a search client is determined to be old and not applicable any more, the driver 115 is configured to de-allocate entry lines for the rule in the TCAM array 140 to free the entry lines as empty entry lines, and to update a mask associated with the search client. For example, the driver 115 assigns value "0" to bits corresponding to the de-allocated entry lines in the mask.

In an example, the driver 115 is implemented as integrated circuits. In another example, the driver 115 is implemented as software instructions executed by a processor. In an embodiment, the driver 115 is an internal component in the electronic device 100. In another embodiment, the driver 115 is an external component that can be coupled with the electronic device 100.

In an embodiment, TCAM arrays are implemented using intellectual property (IP) that is pre-designed with a specific size, such as 64 KB, for the purpose of design time and cost reduction. When some search clients apply relatively small number of rules, the search engine 110 enables the search clients to share a TCAM array and use the TCAM array efficiently.

It is noted that the packet processor 101 can include other suitable search clients (not shown) to request search service from other suitable search engines (not shown). The other search engines can be configured in the same manner as the search engine 110 or can be configured in a different manner from the search engine 110.

In an embodiment, the mask module 150 gets its mask configurations from the key generator 130. In an example, the mask configurations are used to differentiate between lists of rules that relate to different search keys (e.g., even for the same search client). Then, the rules stored in the TCAM array 140 do not need to have policy control (PCL) bits identification as part of the rules in the TCAM array 140, and thus TCAM space is further saved. In another embodiment, rules for the different search clients are all stored in the same TCAM array 140, such that, in an example, a same entry line can be associated to multiple clients by way of the masks. Thus space is saved by avoiding repeated lines.

It is noted that the search engine 110 can be suitably modified. In an example, the TCAM array 140 is configured to store two or more different data types without aligning fields in each entry line, and the entry lines in the TCAM array 140 are individually allocated to the two or more different data types. The masks 151-153 are set according to the entry lines allocation. For example, the entry lines E1-E3, E10 and E14 are used to store IP address criteria of rules to be applied by the search client A; and the entry lines E4-E6 and E12 are used to store MAC address criteria of rules to be applied by the search client B. Thus, TCAM cells in the same columns but different entry lines may be used to store different attribute criteria, such as IP address criteria or MAC address criteria. The masks 151 and 152 can be set according to the entry lines allocation as shown in FIG. 1.

Further, in the example, the key generator 130 is configured to generate two or more search keys for the different data types or the search engine 110 includes multiple key generators to generate two or more different search keys in response to a received packet. For example, the key generator 130 generates a first search key to search for an IP address in order to find a suitable rule to be applied by the search client A, and generate a second search key to search for an MAC address in order to find a suitable rule to be applied by the search client B, in response to a received packet in an example.

The TCAM array 140 compares the first search key to all the entry lines and generates a first match bitmap. The first match bitmap is combined with the mask A to generate a first masked match result. The priority encoder 171 then encodes the first masked match result to generate a first search result. In an example, the first search result points to action codes to be performed by the search client A.

Then, the TCAM array 140 compares the second search key to all the entry lines and generates a second match bitmap. The second match bitmap is combined with the mask B to generate a second masked match result. The priority encoder 172 then encodes the second masked match result to generate a second search result. The second search result points to action codes to be performed by the search client B.

Figure 2:
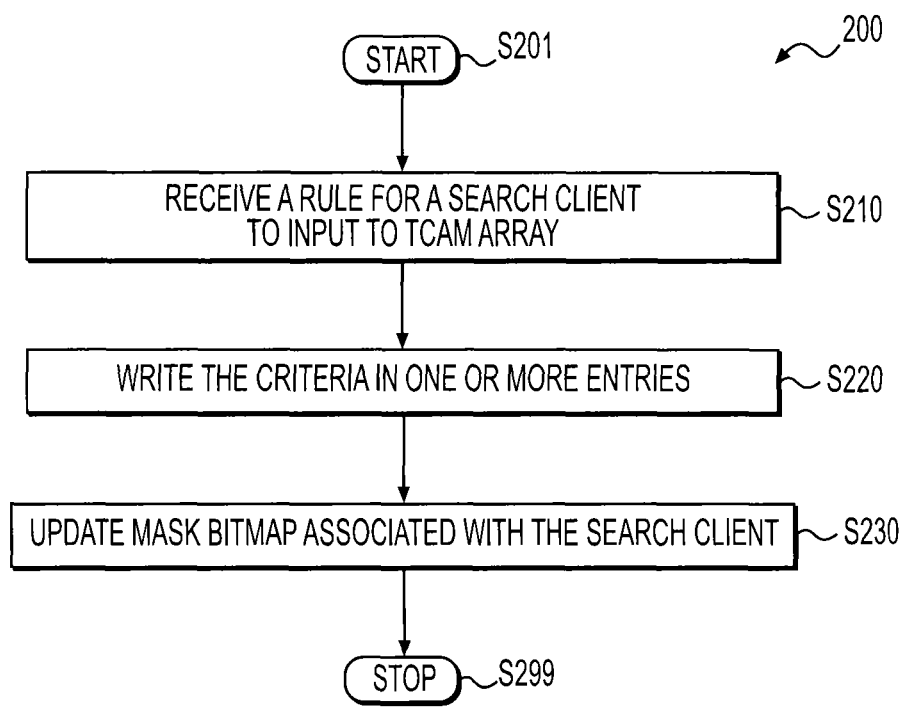
FIG. 2 shows a flow chart outlining a process example 200 for adding a new rule according to an embodiment of the disclosure.

FIG. 2 shows a flow chart outlining a process example 200 for inputting a new rule in a search engine according to an embodiment of the disclosure. The process is executed by a driver, such as the driver 115, to input a new rule in a search engine, such as the search engine 110. The process starts at S201 and proceeds to S210.

At S210, a new rule to be applied by a search client is received. In the FIG. 1 example, the driver 115 receives a new rule to be applied by the search client B for example.

At S220, the criteria of the new rule are written in one or more entry lines of a shared TCAM array. In the FIG. 1 example, the TCAM array 140 enters the write mode, and the driver 115 allocates one or more entry lines of the TCAM array 140 to the search client B, and writes the criteria into the one or more allocated entry lines. In an example, each entry line includes bits allocated for attributes. When the rule does not have requirement for certain attributes, the bits allocated to the certain attributes in the entry lines are assigned to "X" in an example.

At S230, a mask associated with the search client is updated. In the FIG. 1 example, the driver 115 assigns value "1" to bits in the second mask that correspond to the allocated entry lines. Then, the process proceeds to S299 and terminates.

Figure 3:
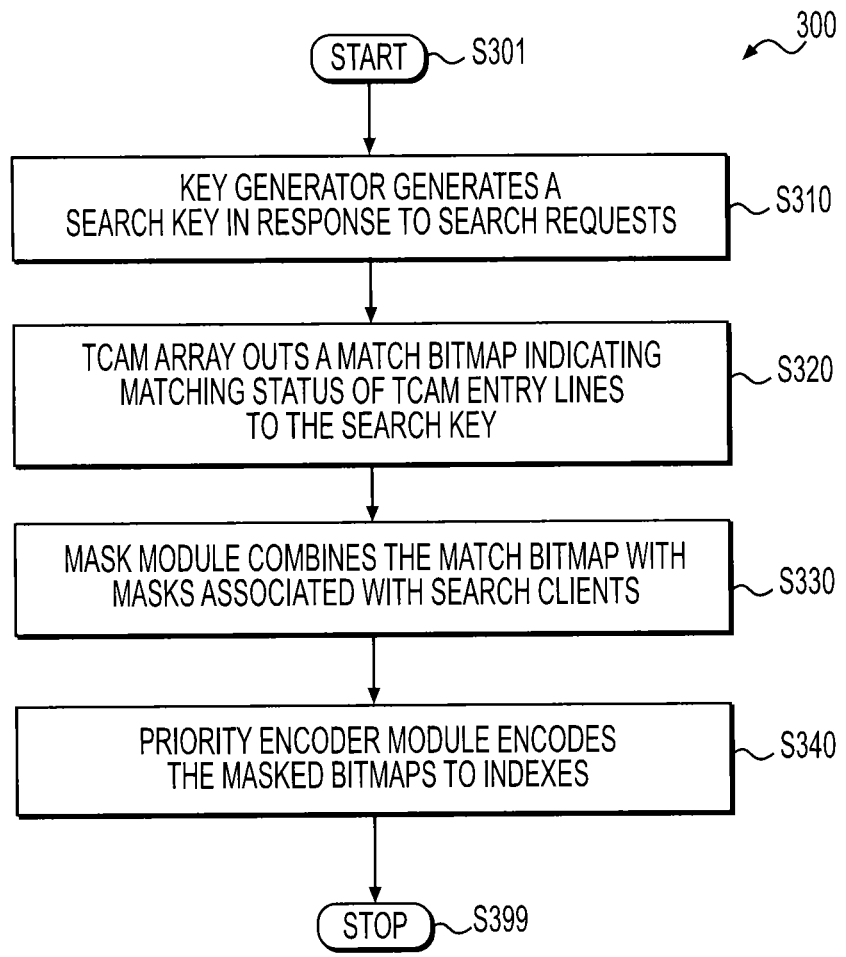
FIG. 3 shows a flow chart outlining a search process 300 according to an embodiment of the disclosure.

FIG. 3 shows a flow chart outlining a process 300 according to an embodiment of the disclosure. In an example, the process 300 is executed in a search engine, such as the search engine 110, with a TCAM array shared by multiple search clients. The process starts at S301, and proceeds to S310.

At S310, a key generator generates a search key in response to search requests. In the FIG. 1 example, the key generator 130 generates a search key in response to search requests from the search clients A-C. In an example, each of the search clients A-C performs a packet processing application, and has a set of rules to be applied for the packet processing application. When the packet processor 101 receives a packet, the search clients A-C send search requests, and the key generator 130 generates the search key based on the received packet.

At S320, the TCAM array outputs a match bitmap indicating matching status of TCAM entry lines to the search key. In the FIG. 1 example, the search key is compared with each of the TCAM entry lines, and the TCAM array 140 outputs a match bitmap of bits to indicate the matching status of TCAM entry lines to the search key.

At S330, a mask module combines the match bitmap with masks associated with the search clients. In the FIG. 1 example, the mask module 150 includes masks 151-153 respectively associated with the search clients A-C. The mask module 150 performs bitwise AND operation of the match bitmap respectively with the masks 151-153 to generate the masked bitmaps 161-163.

At S340, the priority encoder module encodes the masked bitmaps to indexes that point to action codes to be applied by the search clients. In the FIG. 1 example, the priority encoder module 170 includes multiple priority encoders 171-173 associated with the search clients A-C. In an example, the priority encoders 171-173 operate in parallel to encode the masked bitmaps 161-163 to indexes pointing to the action codes to be applied to the search clients A-C. In another example, the priority encoder module sequentially encodes the masked bitmaps to indexes. Then the process proceeds to S399 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
    a content addressable memory (CAM) array having CAM entry lines to be compared with a search key, the CAM array being configured to output a match result indicative of entry lines that match the search key;
    a first mask circuit configured to selectively mask first one or more portions of the match result to generate a first masked match result indicative of first entry lines among the entry lines that match the search key; and
    a first encoder configured to encode the first masked match result to identify a matching entry line in the first entry lines as a first search result.

2. The circuit of claim 1, further comprising:
    a second mask circuit configured to selectively mask second one or more portions of the match result to generate a second masked match result indicative of second entry lines among the entry lines that match the search key; and
    a second encoder configured to encode the second masked match result to identify a matching entry line in the second entry lines as a second search result.

3. The circuit of claim 2, further comprising:
    a key generator configured to generate the search key in response to search requests from a first search client and a second search client.

4. The circuit of claim 1, further comprising:
    a second mask circuit configured to selectively mask second one or more portions of the match result to generate a second masked match result indicative of second entry lines among the entry lines that match the search key; and
    the first encoder configured to encode the second masked match result to identify a matching entry line in the second entry lines as a second search result.

5. The circuit of claim 1, wherein the first encoder is configured to encode the first masked match result to identify the matching entry line according to an order of the CAM entry lines.

6. The circuit of claim 1, wherein the match result is a bitmap and the first mask circuit comprises:
    a memory configured to store a first mask; and
    a logic circuit configured to bitwise combine the bitmap with the first mask with logic operations.

7. The circuit of claim 6, further comprising:
    a driver configured to allocate a plurality of entry lines to a first search client and update the first mask for selectively masking the match result according to the allocation.

8. The circuit of claim 1, wherein the CAM array is ternary CAM array.

9. A method, comprising:
    comparing a search key with entry lines in a content addressable memory (CAM) array to output a match result indicative of entry lines that match the search key;
    selectively masking first one or more portions of the match result to generate a first masked match result indicative of first entry lines among the entry lines that match the search key; and
    encoding the first masked match result to identify a matching entry in the first entry lines as a first search result.

10. The method of claim 9, further comprising:
    selectively masking second one or more portions of the match result to generate a second masked match result indicative of second entry lines among the entry lines that match the search key; and
    encoding the second masked match result to identify a matching entry in the second entry lines as a second search result.

11. The method of claim 10, further comprising:
    generating the search key in response to search requests from a first search client and a second search client.

12. The method of claim 10, wherein:
    generating the first masked match result and generating the second masked match result are performed in parallel.

13. The method of claim 12, wherein:
    encoding the first masked match result and the second masked match result is performed in parallel.

14. The method of claim 10, wherein encoding the first masked match result to identify the matching entry in the first entry lines as the first search result further comprises:
    encoding the first masked match result to identify the matching entry line according to an order of the CAM entry lines.

15. The method of claim 10, wherein selectively masking the first portions of the match result to generate the first masked match result indicative of the first entry lines among the entry lines that match the search key further comprises:
    performing a bitwise logic operation to combine the match result with a first mask.

16. The method of claim 15, further comprising:
    allocating a plurality of entry lines to a first search client; and
    updating the first mask for selectively masking the match result according to the allocation.

17. An apparatus, comprising:
a packet processing circuit configured to generate search requests in response to a packet to determine actions on the packet; and
a search engine comprising:
   at least one key generator configured to generate two or more different search keys in response to a first one of the search requests;
   a content addressable memory (CAM) array having CAM entry lines to be compared with the two or more different search keys, the CAM array being configured to output a match result indicative of entry lines that match a first search key;
   a first mask circuit configured to selectively mask first one or more portions of the match result to generate a first masked match result indicative of first entry lines among the entry lines that match the first search key; and
   a first encoder configured to encode the first masked match result to identify a matching entry line in the first entry lines as a first search result in response to the first one of the search requests.

18. The apparatus of claim 17, wherein the search engine further comprises:
   a second mask circuit configured to selectively mask second one or more portions of the match result to generate a second masked match result indicative of second entry lines among the entry lines that match a second search key; and
   a second encoder configured to encode the second masked match result to identify a matching entry line in the second entry lines as a second search result in response to a second one of the search requests.

19. The apparatus of claim 17, wherein the match result is a bitmap and the first mask circuit comprises:
   a memory configured to store a first mask; and
   a logic circuit configured to bitwise combine the bitmap with the first mask with logic operations.

20. The apparatus of claim 19, further comprising:
   a driver configured to allocate a plurality of entry lines to a first search client of the packet processing circuit and update the first mask according to the allocation.

* * * * *